(12) United States Patent
Callahan et al.

(10) Patent No.: US 9,184,579 B2
(45) Date of Patent: Nov. 10, 2015

(54) WALL GROMMET FOR POWER CONNECTION

(71) Applicant: The Wiremold Company, West Hartford, CT (US)

(72) Inventors: Daron Callahan, New Britain, CT (US); Peter M. Schneider, North Richland Hills, TX (US); David Singer, Austin, TX (US); Kenneth J. Buras, Spring, TX (US)

(73) Assignee: The Wiremold Company, West Hartford, CT (US)

( * ) Notice: Subject to any disclaimer, the term of this patent is extended or adjusted under 35 U.S.C. 154(b) by 0 days.

(21) Appl. No.: 14/447,217

(22) Filed: Jul. 30, 2014

(65) Prior Publication Data

US 2014/0361231 A1 Dec. 11, 2014

Related U.S. Application Data

(63) Continuation of application No. 14/180,930, filed on Feb. 14, 2014, which is a continuation of application No. 13/247,573, filed on Sep. 28, 2011, now Pat. No. 8,651,460.

(60) Provisional application No. 61/492,179, filed on Jun. 1, 2011.

(51) Int. Cl.
| | |
|---|---|
| *B63B 35/03* | (2006.01) |
| *H02G 3/36* | (2006.01) |
| *H02G 3/12* | (2006.01) |
| *H01R 24/78* | (2011.01) |
| *H02G 1/08* | (2006.01) |
| *H01R 3/00* | (2006.01) |

(Continued)

(52) U.S. Cl.
CPC ............ *H02G 3/36* (2013.01); *H01R 24/78* (2013.01); *H02G 1/08* (2013.01); *H02G 1/085* (2013.01); *H02G 3/12* (2013.01); *H01R 3/00* (2013.01); *H01R 13/502* (2013.01); *H01R 2103/00* (2013.01)

(58) Field of Classification Search
USPC .................................................. 254/134.3 R
See application file for complete search history.

(56) References Cited

U.S. PATENT DOCUMENTS

| | | |
|---|---|---|
| 2,427,349 A | 9/1947 | Boynton |
| 2,689,709 A | 9/1954 | Waldschmidt |
| 3,182,960 A | 5/1965 | French |

(Continued)

OTHER PUBLICATIONS

Lamson & Sessions, Carlon Floor Boxes and Covers, Gross Automation, Nov. 2006.

(Continued)

*Primary Examiner* — Lee D Wilson
*Assistant Examiner* — Alvin Grant
(74) *Attorney, Agent, or Firm* — McCormick, Paulding & Huber LLP

(57) ABSTRACT

A wall grommet, which can be installed through the surfaces of walls to route wiring in the walls' interior spaces. In particular, the wall grommet is configured for running power cords inside walls and presenting the electrical connectors of a power cord in a manner such that power cords are hidden from view. The grommet may comprise a housing, which defines an interior space that is adapted to hold either the female connector or male connector of a power cord. The housing may be configured to enclose and secure the electrical connector of the power cord in the housing.

34 Claims, 6 Drawing Sheets

(51) Int. Cl.
*H01R 103/00* (2006.01)
*H01R 13/502* (2006.01)

(56) References Cited

U.S. PATENT DOCUMENTS

| | | | | |
|---|---|---|---|---|
| 3,956,573 | A * | 5/1976 | Myers et al. | 174/488 |
| 3,972,579 | A * | 8/1976 | Kohaut | 439/131 |
| 4,331,832 | A * | 5/1982 | Curtis et al. | 174/57 |
| 4,474,513 | A | 10/1984 | Salyers | |
| 4,640,479 | A * | 2/1987 | Shely et al. | 248/56 |
| 4,675,937 | A * | 6/1987 | Mitomi | 16/2.1 |
| 4,770,643 | A | 9/1988 | Castellani et al. | |
| 4,839,937 | A * | 6/1989 | Oikawa et al. | 174/153 G |
| 4,912,287 | A * | 3/1990 | Ono et al. | 174/153 G |
| 4,928,349 | A * | 5/1990 | Oikawa et al. | 174/153 G |
| 4,950,839 | A * | 8/1990 | Quinn et al. | 174/500 |
| 4,966,374 | A * | 10/1990 | Oikawa et al. | 277/606 |
| 5,003,130 | A * | 3/1991 | Danforth et al. | 174/153 G |
| 5,014,938 | A * | 5/1991 | Potzas | 248/56 |
| 5,033,219 | A * | 7/1991 | Johnson et al. | 42/115 |
| 5,114,365 | A | 5/1992 | Thompson et al. | |
| 5,144,777 | A | 9/1992 | Fishel et al. | |
| 5,167,047 | A * | 12/1992 | Plumley | 174/153 G |
| 5,322,449 | A | 6/1994 | Pizano | |
| 5,337,447 | A * | 8/1994 | Tanaka et al. | 16/2.2 |
| 5,366,318 | A * | 11/1994 | Brancher | 405/36 |
| D360,820 | S * | 8/1995 | Haase | D8/356 |
| 5,504,973 | A * | 4/1996 | Kameyama | 16/2.1 |
| D370,622 | S * | 6/1996 | Byrne | D8/356 |
| 5,575,668 | A * | 11/1996 | Timmerman | 439/131 |
| 5,765,932 | A | 6/1998 | Domina et al. | |
| 5,806,139 | A | 9/1998 | Anderson et al. | |
| 5,981,877 | A | 11/1999 | Sakata et al. | |
| 6,130,384 | A | 10/2000 | Esteves et al. | |
| 6,323,433 | B1 * | 11/2001 | Mahaney et al. | 174/152 G |
| 6,357,934 | B1 | 3/2002 | Driscoll et al. | |
| 6,397,762 | B1 * | 6/2002 | Goldberg et al. | 108/50.02 |
| 6,417,446 | B1 | 7/2002 | Whitehead | |
| 6,462,275 | B1 * | 10/2002 | Daoud | 174/654 |
| 6,492,591 | B1 * | 12/2002 | Metcalf | 174/53 |
| 6,518,498 | B1 | 2/2003 | Bonilla et al. | |
| 6,600,105 | B2 * | 7/2003 | Nakata et al. | 174/660 |
| 6,689,954 | B2 * | 2/2004 | Vaughan et al. | 174/663 |
| 6,737,576 | B1 | 5/2004 | Dinh | |
| 6,756,543 | B1 * | 6/2004 | Kaloustian | 174/67 |
| 6,815,615 | B1 * | 11/2004 | Haulotte et al. | 174/667 |
| D502,864 | S * | 3/2005 | Olson | D8/356 |
| 6,967,285 | B2 * | 11/2005 | Sanroma et al. | 174/668 |
| 6,979,209 | B2 * | 12/2005 | Griepentrog | 439/131 |
| 7,020,931 | B1 * | 4/2006 | Burnett et al. | 16/2.2 |
| 7,064,275 | B2 * | 6/2006 | Henriott et al. | 174/100 |
| 7,078,618 | B2 | 7/2006 | Dinh | |
| 7,183,503 | B2 | 2/2007 | Bowman et al. | |
| 7,193,160 | B2 | 3/2007 | Dinh | |
| D559,660 | S * | 1/2008 | DeCosta et al. | D8/356 |
| 7,442,883 | B2 | 10/2008 | Jolly et al. | |
| 7,481,436 | B2 * | 1/2009 | May et al. | 277/606 |
| D585,726 | S * | 2/2009 | DeCosta | D8/353 |
| 7,528,323 | B2 | 5/2009 | Wu et al. | |
| 7,563,979 | B1 | 7/2009 | Gretz | |
| 7,579,557 | B2 * | 8/2009 | Tapper | 174/650 |
| 7,582,836 | B2 | 9/2009 | Tapper | |
| 7,582,838 | B2 * | 9/2009 | Sharrah | 200/310 |
| 7,641,271 | B1 * | 1/2010 | Haydin et al. | 296/208 |
| 7,665,890 | B2 | 2/2010 | Culbertson et al. | |
| 7,667,145 | B2 | 2/2010 | Dinh et al. | |
| 7,895,709 | B2 * | 3/2011 | Shishikura | 16/2.1 |
| 7,897,870 | B1 | 3/2011 | Gretz | |
| 8,089,002 | B2 * | 1/2012 | Hasegawa | 174/153 G |
| 8,242,365 | B2 * | 8/2012 | Galasso et al. | 174/67 |
| 8,317,537 | B1 * | 11/2012 | Black et al. | 439/538 |
| 8,563,876 | B1 | 10/2013 | Gretz | |
| 8,651,460 | B2 * | 2/2014 | Callahan et al. | 254/134.3 R |
| 2003/0044122 | A1 | 3/2003 | Lee | |
| 2006/0067631 | A1 | 3/2006 | Wang et al. | |
| 2008/0053679 | A1 | 3/2008 | Galasso et al. | |
| 2008/0142499 | A1 | 6/2008 | Byrne | |
| 2009/0111337 | A1 | 4/2009 | Kiely | |
| 2009/0201634 | A1 | 8/2009 | Mori et al. | |
| 2009/0266722 | A1 | 10/2009 | Rogers et al. | |
| 2010/0273388 | A1 | 10/2010 | Carlson et al. | |
| 2011/0070773 | A1 | 3/2011 | Wirtz | |
| 2012/0031888 | A1 | 2/2012 | Byrne | |

OTHER PUBLICATIONS

Lamson & Sessions, Carlon Zip Box Blue Switch and Outlet Boxes, Gross Automation, Jun. 2006.
Monosystems, Inc. PV4A-BS and PV7ADD-BD Poke Through cut sheets created Sep. 4, 2008, publication date unknown.
The Arlington Industries, Inc. 2010 Product Catalog printed Feb. 2010, publication date unknown.
Office Action issued in U.S. Appl. Nos. 90/013,161 and 90/013,361 dated Aug. 7, 2015.

* cited by examiner

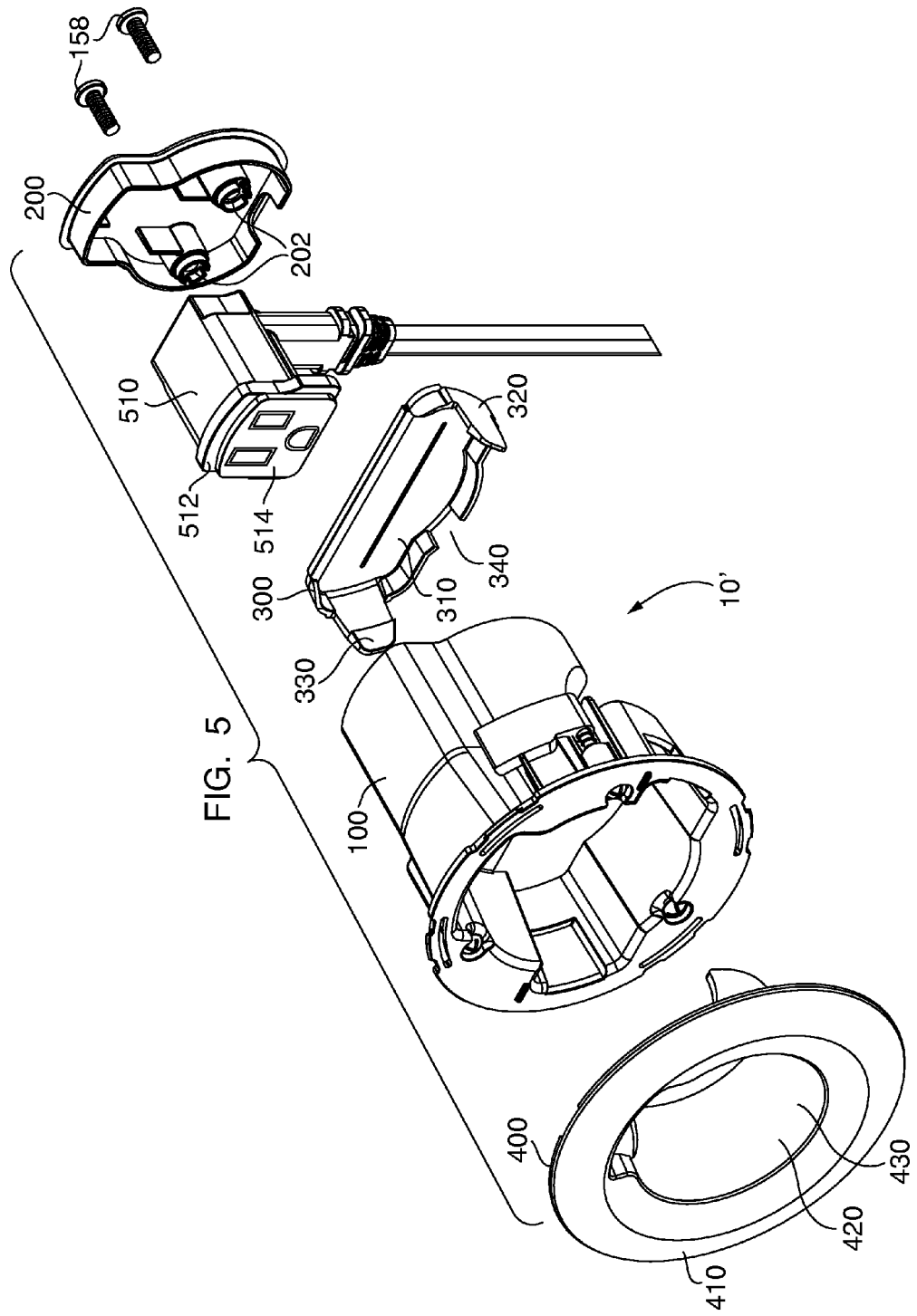

WALL GROMMET FOR POWER CONNECTION

CROSS-REFERENCE TO RELATED APPLICATIONS

This application is a continuation of U.S. patent application Ser. No. 14/180,930 filed Feb. 14, 2014, which is a continuation of U.S. patent application Ser. No. 13/247,573 filed Sep. 28, 2011, which claims the benefit of U.S. Provisional Patent Application No. 61/492,179, filed Jun. 1, 2011, the contents of which are incorporated herein by reference.

BACKGROUND

This invention has particular applicability for the installation of audio and video equipment, where it may be desirable to route power cords and audio/video cables inside walls.

SUMMARY

In accordance with one aspect of the invention, provided is a wall grommet, which can be installed through the surfaces of walls to route wiring in the walls' interior spaces. In one embodiment, the grommet may comprise a housing, which defines an interior space that is adapted to hold either the female connector (also referred to a "female end") or male connector (also referred to as a "male end") of a power cord. The housing may have tubular construction. A wire-egress opening may be provided in the tubular wall of the housing so that cables (e.g., low-voltage audio/video cables) may be passed through the wire-egress opening from the wall's interior space. Also, the housing may comprise an annular flange that extends outwardly from the front opening of the housing. The grommet's housing is adapted to be inserted through a hole in the surface of a wall and the exterior flange is adapted to be mounted substantially flush with the surface of the wall. Thus, the wall grommet can be mounted flush on the surface of a wall and the electrical connector of the power cord may be recessed from the wall.

In another embodiment, the grommet may further comprise a wire-egress cover and/or a trim ring. The wire egress cover is configured to fit in the interior space of the housing and cover the wire egress opening. The trim ring has a planar surface that defines an opening, and is adapted to engage the housing and cover the flange.

In accordance with another aspect of the invention, provided is a wall grommet assembly comprising two wall grommets and a power cord. The two grommets and the power cord may be provided in accordance with the preceding descriptions. The wall grommet assembly may be installed by cutting out two holes on the surface of a wall and running the power cord inside the wall such that the female connector comes out of the wall through one hole and the male connector comes out of the wall through the other hole. Then, the female connector of the power cord can be secured in one grommet and the male connector of the power cord can be secured in the other grommet. The grommets can each be inserted through holes in a wall and secured to the surface of the wall.

In accordance with yet another aspect of the invention, provided is a kit for routing wiring in the interior spaces of walls. In one embodiment the kit comprises a saw, a fish stick, two grommets and a power cord. The two grommets and the power cord may be provided in accordance with the preceding descriptions. The saw may be any conventional saw that can be used to cut out holes in the surface of walls (e.g., drywall saw). The fish stick comprises a rod with a hook (or other means for holding a cable) on one end.

BRIEF DESCRIPTION OF DRAWINGS

The foregoing summary, as well as the following detailed description of the preferred embodiments, is better understood when read in conjunction with the appended drawings. For the purpose of illustrating the invention, there is shown in the drawings embodiments that are presently preferred, it being understood, however, that the invention is not limited to the specific embodiments disclosed. In the drawings:

FIG. 5 shows an exploded view of the wall grommet of FIG. 4 with a female connector;

DETAILED DESCRIPTION

Figure 1:
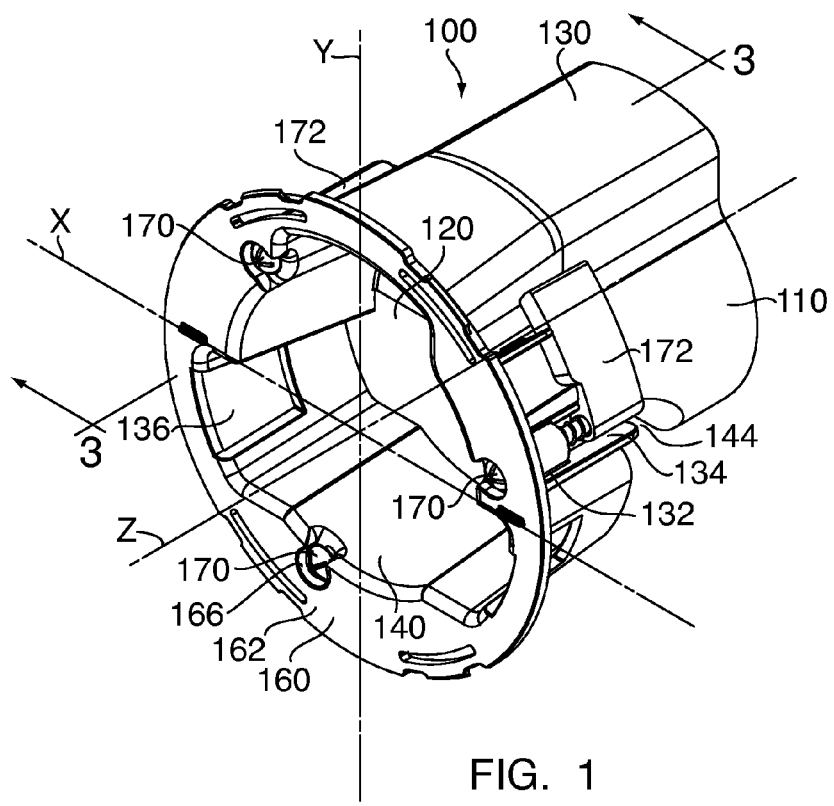
FIG. 1 shows a front perspective view of an exemplary power module of a wall grommet.

Before the present invention is described in further detail, it is to be understood that the invention is not limited to the particular embodiments described. It is also to be understood that the terminology used herein is for the purpose of describing particular embodiments only, and is not intended to limit the scope of the claims of the present application.

In accordance with one aspect of the invention, provided is a wall grommet 10, which can be installed through the surface of a wall to route wiring in the wall's interior space. Grommet 10 can be used to route power cords and low-voltage cables for audio and video applications.

In one embodiment, grommet 10 comprises a power module 100, a back cover 200, a wire egress cover 300 and a trim ring 400. However, it is also contemplated that grommet 10, in another embodiment, may comprise only a power module 100 and a back cover 200. Still in other embodiments, grommet 10 may further optionally comprise a wire egress cover 300 or a trim ring 400.

Figure 2:
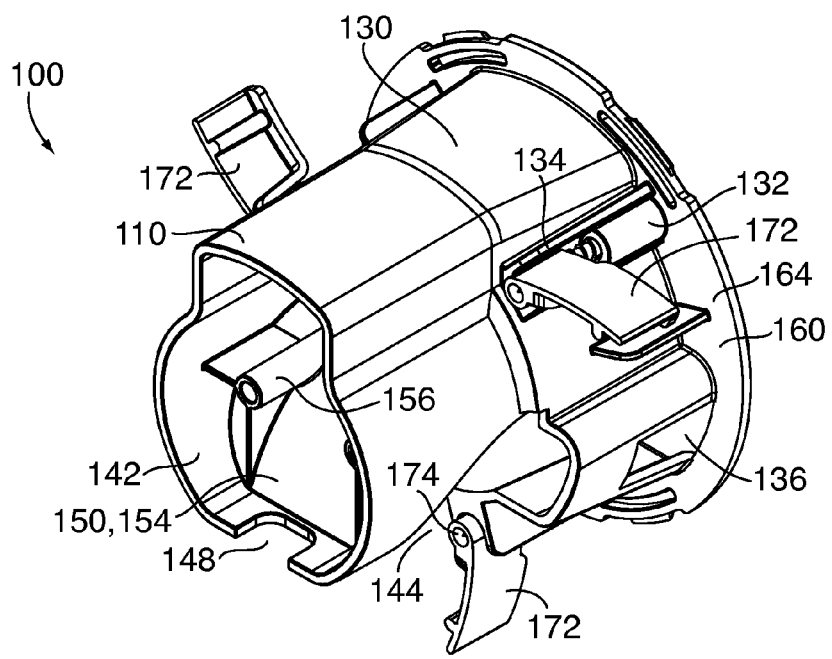
FIG. 2 shows a back perspective view of the power module of FIG. 1.

As shown in FIGS. 1 and 2, power module 100 comprises a housing 110, which defines an interior space 120 that is adapted to hold either the female connector 510 (also referred to a "female end") or male connector 520 (also referred to as a "male end") of a power cord 500. Housing 110 may comprise a tubular wall 130 having a substantially tubular shape that defines a front opening 140 and a back opening 142. Tubular wall 130 extends between the front opening 140 and back opening 142 of housing 110. Also, a wire-egress opening 144 may be provided in tubular wall 130 of housing 110 so that the interior space 120 of housing 110 communicates with a space outside of housing 110, other than through the front and back openings 140, 142. Further, a relief cut 148 may be provided adjacent to back opening 142 for accommodating a power cord 500. As shown in the embodiment illustrated in FIGS. 1 and 2, housing 110 may have an irregular tubular shape. For example, the shape of a cross-section transverse to a longitudinal axis Z may be asymmetric about a horizontal axis X and/or a vertical axis Y. Further, the cross-sections transverse to the longitudinal axis Z may be non-uniform, i.e., the shape of the cross-sections transverse to the longitudinal axis Z may vary along the longitudinal axis Z.

Figure 3:
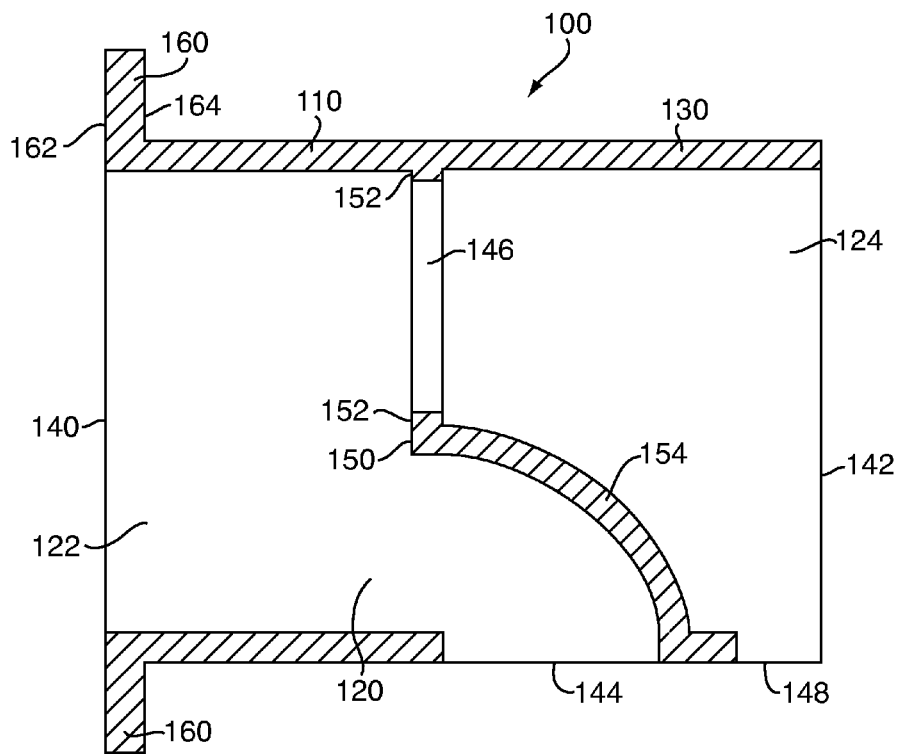
FIG. 3 shows a cross sectional view of the power module of FIGS. 1 and 2 taken along cross-sectional line C-C shown in FIGS. 1 and 2.

Additionally, as shown in FIG. 3, housing 110 may comprise an interior wall 150. Interior wall 150 is disposed inside housing 110 and extends from tubular wall 130 across interior space 120 of housing 110 to create a separation in the interior space 120 of housing 110. Interior wall 150 defines a front interior space 122 and a back interior space 124 inside housing 110. A first portion 152 of interior wall 150 preferably extends substantially vertically from the interior of tubular wall 130 and into interior space 120 of housing 110. The first portion 152 of interior wall 150 includes an electrical-connector opening 146 that connects the front interior space 122 and the back interior space 124 of housing 110. The back interior space 124 of housing 110 is adapted to receive the electrical connector 510, 520 of a power cord 500, such that the electrical connector 510, 520 abuts interior wall 150 and the female receptacle or male prongs of electrical connector 510, 520 are accessible through the electrical-connector opening 146.

Figure 7:
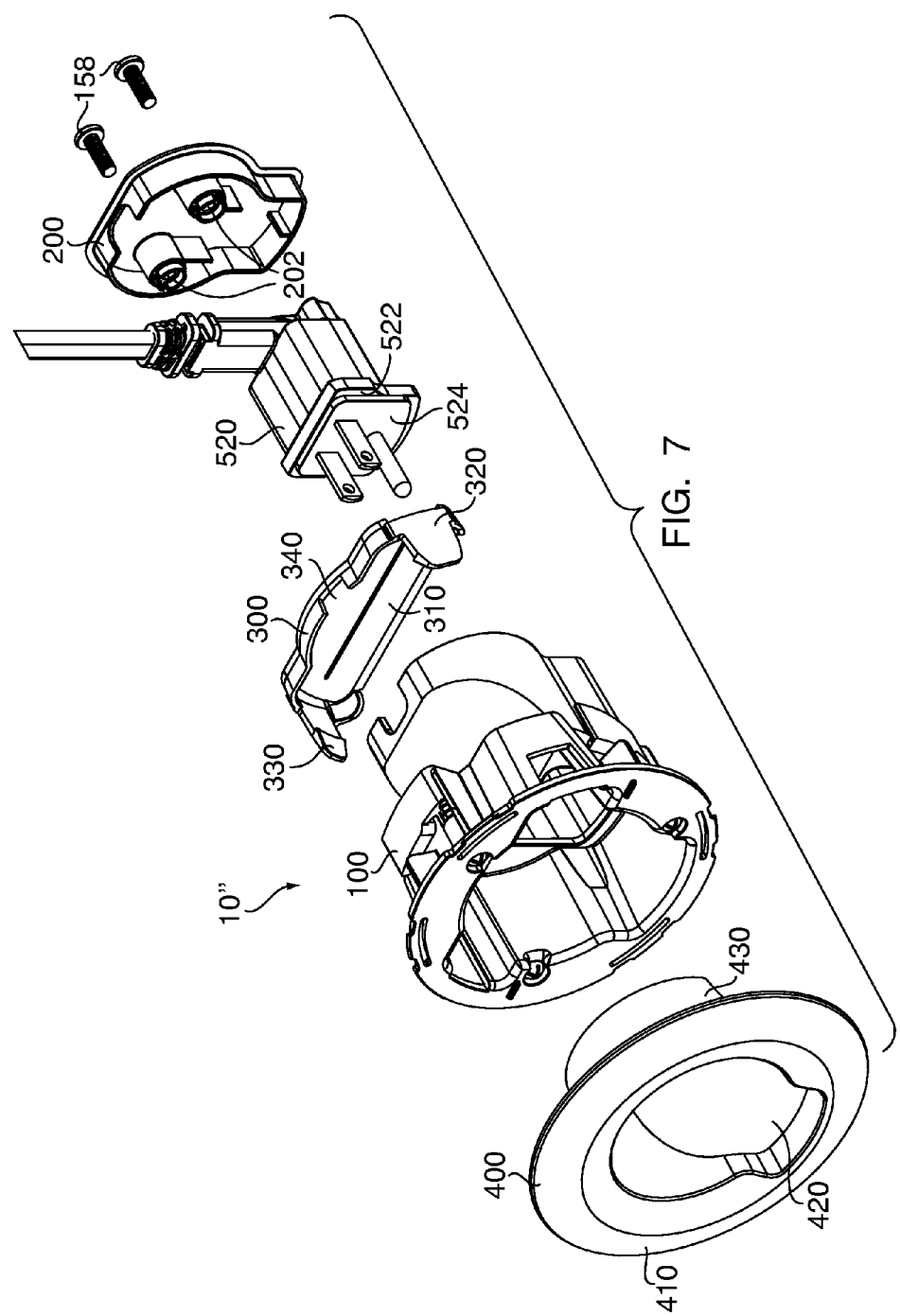
FIG. 7 shows an exploded view of the wall grommet of FIG. 6 with a male connector.

As shown in FIGS. 5 and 7, the electrical connector 510, 520 may have a body comprising a flange 512, 522 configured to engage the interior wall 150 of the housing 110 around the electrical-connector opening 146. Further, the body of the electrical connector 510, 520 may further comprise a front face 514, 524 that is configured to be disposed substantially vertically when the electrical connector 510, 520 is disposed inside the housing 110 and the grommet 10 is mounted on a surface of a vertical wall. The body of the electrical connector 510, 520 extends back from the front face 514, 524 generally perpendicularly to the plane of the front face 514, 524. As shown in FIGS. 5 and 7, the power chord 500 of the electrical connector 510, 520 may extend transversely to the body of the electrical connector 510, 520 so that the power chord 500 can be routed vertically inside the wall. The front face 514, 524 of the electrical connector 510, 520, which has the female receptacle or male prongs disposed thereon, may be configured to protrude from the flange 512, 522 such that the front face of the electrical connector 510, 520 extends through the electrical-connector opening 146 when the flange 512, 522 engages the interior wall 150 of the housing 110 around the electrical-connector opening 146.

The front opening 140 and the front interior space 122 are adapted to provide access to the electrical connector 510, 520 of power cord 500, which is disposed in the back interior space 124 of housing 110, so that the mating connector end of another power cord can be connected to the electrical connector 510, 520 disposed in the back interior space 124 of housing 110. Thus, grommet 10 can be mounted flush on a surface and the electrical connector 510, 520 of power cord 500 may be recessed from the surface. As shown in FIGS. 5-8, grommet 10 is configured such that when grommet 10 is mounted flush on the surface of a vertical wall, the front face 514, 524 of the electrical connector 510, 520 is disposed substantially vertically and parallel to the surface of the vertical wall, and the power cord 500 extends substantially transversely to the longitudinal axis Z of housing 110 and substantially vertically inside the wall.

Further, as shown in FIG. 3, a second portion 154 of interior wall 150 extends from the interior of the tubular wall 130 at the back edge of the wire-egress opening 144 and slopes/curves up and forward toward front interior space 122 and front opening 140. This particular configuration of the second portion 154 of interior wall 150 guides any wires or cables that are inserted through wire-egress opening 144 toward front interior space 122 and front opening 140. Thus, when grommet 10 is installed in a wall, wires or cables (e.g., low voltage audio/video cables) can be easily fed from the interior space of a wall out trough the wire-egress opening 144 of power module 100. Further, screw posts 156 may disposed on the backside of the second portion 154 of interior wall 150, in the back interior space 124 of housing 110, for engaging fasteners 158, which secure back cover 200 to power module 100.

Also, as shown in FIGS. 1 and 2, power module 100 may comprise an annular flange 160 that extends outwardly from the front opening 140 of housing 110 and defines a substantially planar surface transverse to the longitudinal axis Z of housing 110. Annular flange 160 comprises a front surface 162 and a back surface 164. When the housing 110 of power module 100 is inserted through an appropriately sized hole in the surface of a wall, the back surface 164 of flange 160 abuts the surface of the wall and prevents power module 100 from falling through the hole. Extending from the front surface 162 through to the back surface 164 of flange 160 are at least two holes 166 adapted to receive and engage fasteners 170 (e.g. screws, nails, etc.) for securing power module 100 to a wall surface. Thus, once power module 100 is inserted through a hole in the surface of a wall, fasteners 170 can be inserted through holes 166 of flange 160 to secure power module 100 to the wall.

Figure 4:
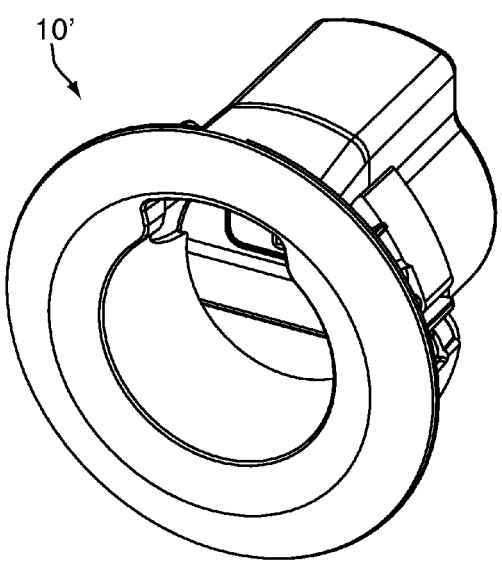
FIG. 4 shows a front perspective view of a wall grommet assembled with a female connector.
Figure 6:
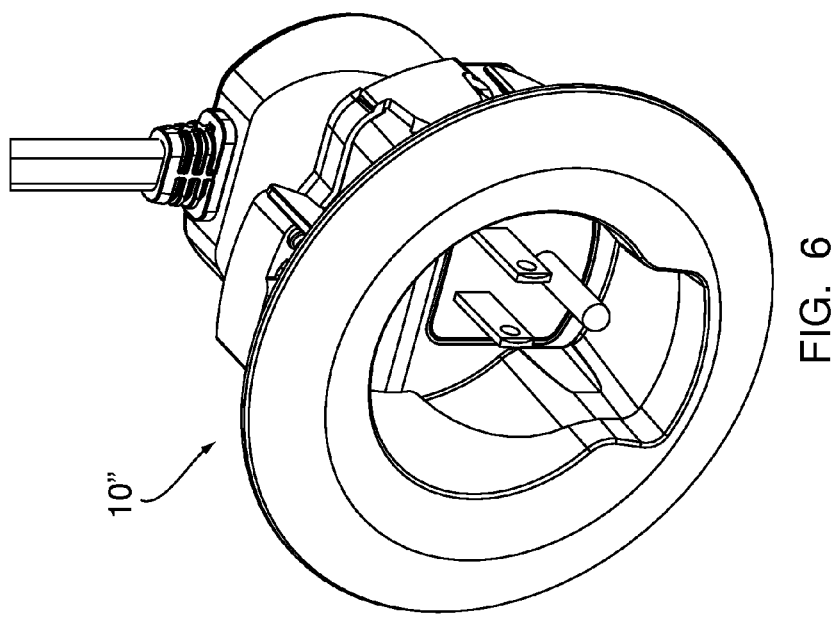
FIG. 6 shows a front perspective view of a wall grommet assembled with a male connector.

Additionally, as shown in FIGS. 1 and 2, in one embodiment, toggles 172 may be provided in conjunction with fasteners 170 to secure module 100 on the surface of a wall. Toggles 172 comprise bores 174 that are adapted to engage fasteners 170. Toggles 172 may be disposed adjacent to the holes 166 on the back surface 164 of flange 160, such that the bores 174 of toggles 172 are aligned with the holes 166 on the back surface 164 of flange 160. As shown in the embodiment of FIGS. 1 and 2, toggles 172 may be held in mounts 132 provided on an outer surface of housing 110. Toggles 172 and mounts 132 are preferably configured to allow toggles 172 to pivot about a longitudinal axis of bores 174 parallel to longitudinal axis Z. The configuration of toggles 172 and mounts 132 allow toggles 172 to rotate between a closed position (as shown in FIGS. 4 and 6) to an open position (as shown in FIGS. 1 and 2) when a fastener 170 is rotated in a tightening direction (e.g., clockwise). Likewise, when a fastener 170 is rotated in a loosening direction (e.g., counter clockwise), toggles 172 may rotate from an open position to a closed position. Preferably, mounts 132 include detents 134 that prevent toggles 172 from moving in an opening direction past a certain point, such that toggles 172 are substantially radially aligned with longitudinal axis Z of power module 100. As power module 100 is inserted through a hole in the surface of a wall, toggles 172 may be held in a closed position. Once power module 100 has been inserted through a hole in the surface of a wall and fasteners 170 are tightened, toggles 172 may move into an open position and engage the backside of the wall to secure power module 100 to the wall.

As shown in FIGS. 5 and 7, grommet 10 further comprises back cover 200 that is adapted to engage housing 110 of power module 100 at the back opening 142. Back cover 200 comprises at least two holes 202 for receiving fasteners 158. The holes 202 are configured to align with the screw posts 156 so that fasteners 158 may be inserted through holes 202 in back cover 200 and engage screw posts 156. Once the electrical connector 510, 520 of power cord 500 is inserted into back interior space 124 of housing 110, electrical connector 510, 520 can be secured in housing 110 by attaching back cover 200 to power module 100 and inserting fasteners 158 through holes 202 and into screw posts 156. Thus, by enclosing the back interior space 124 of housing 110 with back cover 200, an electrical connector 510, 520 can held and secured in the back interior space 124 such that the female receptacle or male prongs of electrical connector 510, 520 can be accessed from the front opening 140 and front interior space through the electrical-connector opening 146.

Also, as shown in FIGS. 5 and 7, Grommet 10 may further optionally comprise a wire egress cover 300. Wire egress cover 300 preferably includes a planar surface 310 that is shaped to match the shape of a portion of a cross section of the interior space 120 of power module 100 such that the interior space—between the second portion 154 of interior wall 150 and the interior of tubular wall 130—that leads to wire-egress opening 144 can be covered while still allowing wires or cables to be passed through. Wire egress cover may further include arms 320 that extend orthogonally from surface 310. Arms 320 are adapted to fit in the front interior space 122 of housing 110 and engage the interior surface of tubular wall 130 so that wire egress cover 300 may be secured to power module 100. Wire egress cover 300 may also include tabs 330 disposed on the free ends of arms 320. Tabs 330 are configured to engage recesses 136 in the interior surface of tubular wall 130. Wire egress cover 300 may further include a notch 340 cut out to allow wires or cables to be passed through the wire-egress opening 144 when the egress cover 300 is installed.

Additionally, as shown in FIGS. 5 and 7, grommet 10 may further optionally comprise a trim ring 400. Trim ring 400 includes a substantially planar surface 410 that defines a central opening 420 for allowing access to the interior space 120 of power module 100. Extending orthogonally from surface 410 is a semi-cylindrical wall 430. Semi-cylindrical wall 430 partially encircles central opening 420 on surface 410 and is adapted to extend inwardly into interior space 120 of housing 110. Semi-cylindrical wall 430 is adapted to engage the interior surface of tubular wall 130 so that trim ring 400 may be secured to power module 100. Trim ring 400 is preferably adapted to securely fit on the flange 160 of power module 100 without the need for fasteners. Trim ring 400 is configured to cover fasteners 170 on flange 160 and provide an even finished surface around the front opening 140 of power module 100. Thus, trim ring 400 provides a clean finished appearance to the portion of grommet 10 that is visible after installation in a wall.

Figure 8:
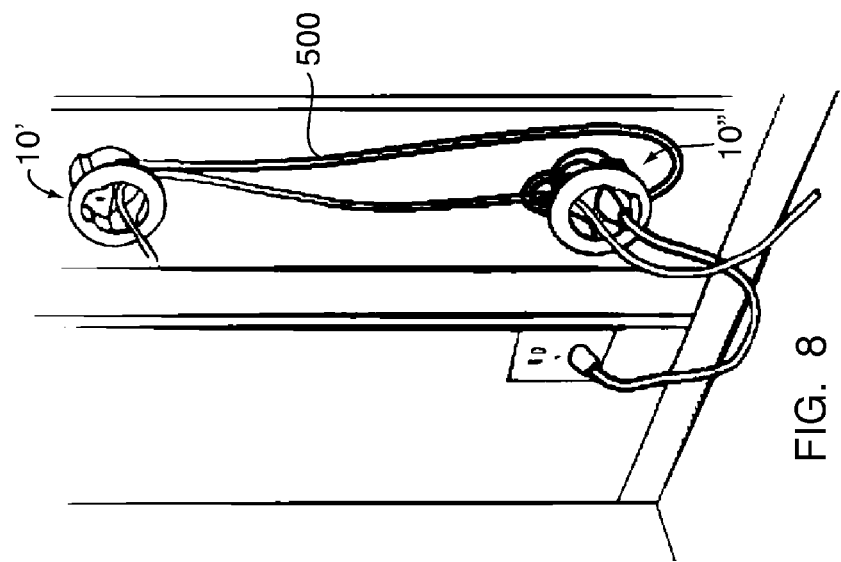
FIG. 8 shows a wall grommet assembly.

In accordance with another aspect of the invention, as shown in FIG. 8, provided is a wall grommet assembly 600. Wall grommet assembly 600 may comprise two wall grommets 10', 10" (as described above) and a power cord 500. Power cord 500 preferably has a female connector 510 on one end and a male connector 520 on the other end. Further, power cord 500 preferably comprises type NM-B cable, or other type of cable that is rated for use inside walls. As shown in FIGS. 4 and 5, grommet 10' is used in conjunction with the female connector 510 of power cord 500, as shown in FIGS. 4 and 5. As shown in FIGS. 6 and 7, grommet 10" is used in conjunction with the male connector 520 of power cord 500, as shown in FIGS. 6 and 7. As shown in FIG. 8, wall grommet assembly 600 may be installed by cutting out two holes on the surface of a wall and running power cord 500 inside the wall such that female connector 510 comes out of the wall through one hole and male connector 520 comes out of the wall through the other hole. Then, female connector 510 can be secured in grommet 10' and male connector 520 can be secured in the other grommet 10". Grommets 10', 10" can then be inserted through their respective holes in the wall and secured to the surface of the wall using fasteners (e.g. screws, nails, etc.) through holes 166 in flange 160. Additionally, other cables (e.g., low-voltage audio/video cables) may be passed through the wire-egress opening 144 of one grommet 10', through the interior space of the wall, and out through the wire-egress opening 144 of the other grommet 10". Wire egress covers 300 and trim rings 400 may also be secured on the power modules 100', 100", as desired.

Figure 9:
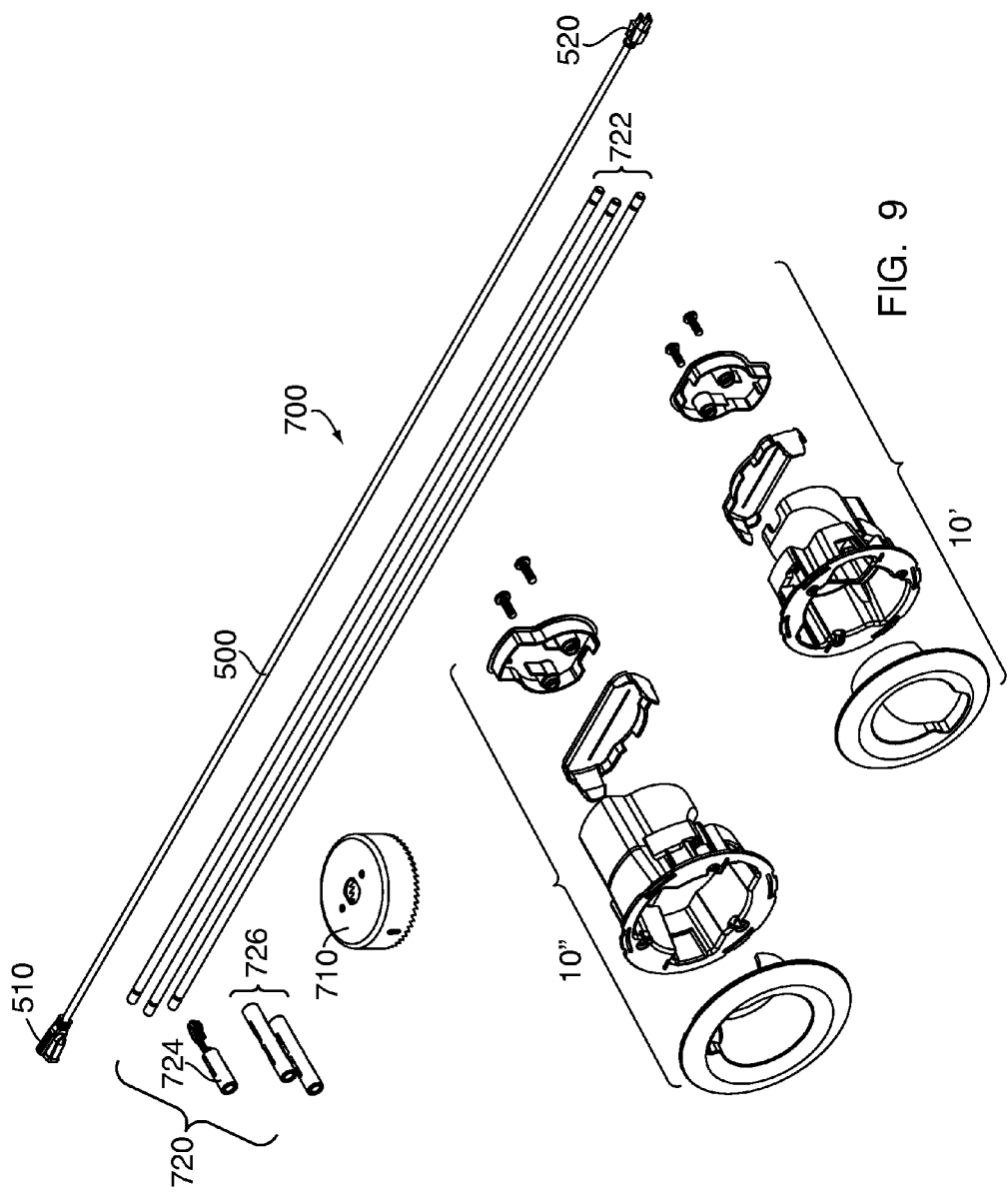
FIG. 9 shows a wall grommet kit.

In accordance with yet another aspect of the invention, as shown in FIG. 9, provided is a kit 700 for routing wiring in the interior spaces of walls. In one embodiment the kit 700 comprises a saw 710, a fish stick 720, two grommets 10', 10", and a power cord 500. Saw 710 may be any conventional saw that can be used to cutout holes in the surface of walls (e.g., drywall saw). Fish stick 720 comprises a rod 722 with a hook 724 (or other means for holding a cable) on one end. The rod 722 may have a one-piece construction, or it may be provided in multiple sections (as shown) that are connected by connectors 726. The two grommets 10', 10" and power cord 500 may be provided in accordance with the preceding descriptions.

Saw 710 may be used to cut out holes on the surface of a wall. Once two holes are cut out, fish stick 720 may be inserted through one of the holes and into the wall such that the hook 724 on the end of the rod 710 can be accessed through the other hole. One end of the power cord 500 can be secured on the hook 724 and inserted through the hole such that the power cord 500 can be fished through the inside of the wall by pulling out the other end of fish stick 720 through the other hole. Power cord 500 may be fished through the inside of the wall such that one end of the cord comes out of the wall through one hole and the other end of the cord comes out of the wall through the other hole. Then, female connector 510 can be secured in grommet 10' and male connector 520 can be secured in the other grommet 10". Grommets 10', 10" can then be inserted through their respective holes in the wall and secured to the surface of the wall using fasteners (e.g. screws, nails, etc.) through holes 166 in flange 160. Additionally, other cables (e.g., low-voltage audio/video cables) may be passed through the wire-egress opening 144 of one grommet 10', through the interior space of the wall, and out through the wire-egress opening 144 of the other grommet 10". Wire egress covers 300 and/or trim rings 400 may also be secured on the power modules 100', 100", as desired.

While the invention has been described with reference to the preferred embodiments thereof, it will be appreciated by those of ordinary skill in the art that modifications can be made to the structure and elements of the invention without departing from the spirit and scope of the invention as a whole.

What is claimed is:

1. A wall grommet for an electrical connector, comprising:
a housing that defines a front opening, a front interior space and a back interior space, the housing including a flange disposed around the front opening and extending outwardly from said front opening, and an interior wall separating the front interior space and the back interior space, the interior wall defining an electrical-connector opening that connects the front interior space and the back interior space;
wherein the back interior space of the housing is configured such that an electrical connector of a power cord can be inserted into and enclosed in the back interior space of the housing;
wherein the electrical connector is accessible from the front opening and front interior space of the housing through the electrical-connector opening; and
wherein the housing defines a power cord opening to the back interior space configured to allow the power cord of the electrical connector to extend out of the housing transversely to a longitudinal axis of the housing;

wherein the electrical connector comprises a front face and a body extending generally perpendicularly to a plane defined by the front face;

wherein the power cord extends transversely to the body of the electrical connector; and wherein when the grommet is mounted flush on the surface of a vertical wall, the front face of the electrical connector is disposed vertically and the power cord extends vertically.

2. The wall grommet of claim 1, wherein the tubular housing further includes a wire-egress opening.

3. The wall grommet of claim 2, wherein a portion of the interior wall slopes upward and forward from a back edge of the wire egress opening toward the front interior space and the front opening.

4. The wall grommet of claim 1, wherein the electrical connector comprises a flange configured to engage the interior wall of the housing around the electrical-connector opening.

5. The wall grommet of claim 4, wherein the electrical connector comprises a front face protruding from the flange such that the front face of the electrical connector is configured to extend through the electrical-connector opening when the flange engages the interior wall of the housing around the electrical-connector opening.

6. A kit for routing a power cord inside a wall, the kit comprising:
a power cord terminating with a first electrical connector at a first end and terminating with a second electrical connector at a second end;
a first wall grommet comprising a housing configured to enclose and secure the first electrical connector of the power cord; and
a second wall grommet comprising a housing configured to enclose and secure the second electrical connector of the power cord;
wherein each of the first wall grommet and second wall grommet is configured to be mounted on a wall, such that the power cord can be routed through an interior space of the wall and retained inside the wall.

7. The kit according to claim 6, wherein the power cord comprises type NM-B cable, or other type of cable that is rated for use inside walls.

8. The kit according to claim 7, wherein the first electrical connector is a female receptacle connector and the second electrical connector is a male prong connector.

9. The kit according to claim 7, wherein the first electrical connector and the second electrical connector are integrally formed with the power cord.

10. The kit according to claim 6,
wherein the housing of each of the first wall grommet and second wall grommet is configured to enclose and secure the first electrical connector of the power cord and is also configured to enclose and secure the second electrical connector of the power cord.

11. The kit according to claim 6, wherein the first wall grommet is substantially identical to the second wall grommet.

12. The kit according to claim 6
wherein each of the first and second electrical connectors of the power cord comprises a front face and a body extending generally perpendicularly to a plane defined by the front face;
wherein the power cord extends transversely to each body of the first electrical connector and the second electrical connector; and
wherein when the first wall grommet or second wall grommet is mounted flush on the surface of a vertical wall, the front face of the first electrical connector or second electrical connector, respectively, is disposed generally vertically and the power cord extends generally vertically.

13. The kit according to claim 6,
wherein the housing of the first wall grommet is configured to hold the first electrical connector of the power cord recessed from the surface of the wall when the housing of the first wall grommet is mounted on the wall; and
wherein the housing of the second wall grommet is configured to hold the second electrical connector of the power cord recessed from the surface of the wall when the housing of the second wall grommet is mounted on the wall.

14. The kit according to claim 6, wherein the housing of each of the first wall grommet and the second wall grommet defines a front opening, a front interior space, a back interior space, and an interior wall separating the front interior space and the back interior space, the interior wall having a vertical portion defining a connector opening that connects the front interior space and the back interior space.

15. The kit according to claim 14,
wherein each of the first and second electrical connectors of the power cord comprises a flange configured to engage the interior wall of the housing around the electrical-connector opening; and
wherein each of the first and second electrical connectors of the power cord comprises a front face protruding from the flange such that the front face of the electrical connector is configured to extend through the electrical-connector opening when the flange engages the interior wall of the housing around the electrical-connector opening.

16. The kit according to claim 14,
wherein the back interior space defined by the housing of the first wall grommet is configured to enclose the first electrical connector of the power cord, such that the first electrical connector of the power cord is accessible from the front opening and front interior space of the housing through the electrical-connector opening; and
wherein the back interior space defined by the housing of the second wall grommet is configured to enclose the second electrical connector of the power cord, such that the second electrical connector of the power cord is accessible from the front opening and front interior space of the housing through the electrical-connector opening.

17. The kit according to claim 16, wherein the housing of each of the first wall grommet and the second wall grommet defines a power cord opening to the back interior space configured to allow the power cord to extend out of the housing transversely to a longitudinal axis of the housing that extends perpendicularly to a plane defined by the front opening of the housing.

18. The kit according to claim 14,
wherein the housing of each of the first wall grommet and the second wall grommet further comprises a wire egress opening configured to provide access to the front interior space of the housing,
wherein a portion of the interior wall of each of the first wall grommet and the second wall grommet curves from a back edge of the wire egress opening toward the front interior space and the front opening.

19. The kit according to claim 18, further comprising:
a saw for cutting holes into a surface of the wall; and
a fish stick for fishing the power cord through the holes in the wall.

20. A power cord and wall grommet assembly for routing the power inside a wall, the assembly comprising:
a first wall grommet comprising a housing;
a second wall grommet comprising a housing; and
a power cord having a first electrical connector disposed inside the housing of the first wall grommet and the power cord having a second electrical connector disposed inside the housing of the second wall grommet;
wherein the housing of the first wall grommet is configured to enclose and secure the first electrical connector of a power cord;
wherein the housing of the second wall grommet is configured to enclose and secure a second electrical connector of the power cord; and
wherein each of the first wall grommet and second wall grommet is mounted on a wall and the power cord is routed through an interior space of the wall and retained inside the wall.

21. The assembly according to claim 20, wherein the power cord comprises type NM-B cable, or other type of cable that is rated for use inside walls.

22. The assembly according to claim 21, wherein the first electrical connector is a female receptacle connector and the second electrical connector is a male prong connector.

23. The assembly according to claim 21, wherein the first electrical connector and the second electrical connector are integrally formed with the power cord.

24. The assembly according to claim 20, wherein the housing of each of the first wall grommet and second wall grommet is configured to enclose and secure the first electrical connector of the power cord and is also configured to enclose and secure the second electrical connector of the power cord.

25. The assembly according to claim 20, wherein the housing of each of the first wall grommet and the second wall grommet defines a front opening, a front interior space, a back interior space, and an interior wall separating the front interior space and the back interior space, the interior wall having a vertical portion defining a connector opening that connects the front interior space and the back interior space.

26. The assembly according to claim 25,
wherein each of the first and second electrical connectors of the power cord comprises a flange configured to engage the interior wall of the housing around the electrical-connector opening; and
wherein each of the first and second electrical connectors of the power cord comprises a front face protruding from the flange such that the front face of the electrical connector is configured to extend through the electrical-connector opening when the flange engages the interior wall of the housing around the electrical-connector opening.

27. The assembly according to claim 20,
wherein each of the first and second electrical connectors of the power cord comprises a front face and a body extending generally perpendicularly to a plane defined by the front face;
wherein the power cord extends transversely to each body of the first electrical connector and the second electrical connector; and wherein the front face of the first electrical connector and the front face of the second electrical connector are disposed generally vertically and the power cord extends generally vertically.

28. The assembly according to claim 25,
wherein the back interior space defined by the housing of the first wall grommet encloses the first electrical connector of the power cord, such that the first electrical connector of the power cord is accessible from the front opening and front interior space of the housing through the electrical-connector opening; and
wherein the back interior space defined by the housing of the second wall grommet encloses the second electrical connector of the power cord, such that the second electrical connector of the power cord is accessible from the front opening and front interior space of the housing through the electrical-connector opening.

29. The assembly according to claim 28, wherein the housing of each of the first wall grommet and the second wall grommet defines a power cord opening to the back interior space, which allows the power cord to extend out of the housing transversely to a longitudinal axis of the housing that extends perpendicularly to a plane defined by the front opening of the housing.

30. The assembly according to claim 20, wherein the first wall grommet is structurally substantially identical to the second wall grommet.

31. A kit for routing a power cord inside a wall, the kit comprising:
a power cord rated for use inside walls, the power cord terminating with a female receptacle connector at a first end and terminating with a male prong connector at a second end;
a first wall grommet comprising a housing configured to enclose and secure the female receptacle connector of the power cord, such that the female receptacle connector of the power cord is accessible from a front opening of the housing of the first wall grommet; and
a second wall grommet comprising a housing configured to enclose and secure the male prong connector of the power cord, such that the male prong connector of the power cord is accessible from a front opening of the housing of the second wall grommet;
wherein each of the first wall grommet and second wall grommet is configured to be mounted on a wall, such that the power cord can be routed through an interior space of the wall and retained inside the wall.

32. The kit according to claim 31,
wherein the housing of the first wall grommet is configured to hold the female receptacle connector of the power cord recessed from the surface of the wall when the housing of the first wall grommet is mounted on the wall; and
wherein the housing of the second wall grommet is configured to hold the male prong connector of the power cord recessed from the surface of the wall when the housing of the second wall grommet is mounted on the wall.

33. The kit according to claim 31, wherein the power cord comprises type NM-B cable.

34. The kit according to claim 31, wherein the first electrical connector and the second electrical connector are integrally formed with the power cord.

* * * * *